US007507321B2

(12) United States Patent
Aksu et al.

(10) Patent No.: US 7,507,321 B2
(45) Date of Patent: Mar. 24, 2009

(54) EFFICIENT GALLIUM THIN FILM ELECTROPLATING METHODS AND CHEMISTRIES

(75) Inventors: Serdar Aksu, Santa Clara, CA (US); Jiaxiong Wang, Castro Valley, CA (US); Bulent M. Basol, Manhattan Beach, CA (US)

(73) Assignee: Solopower, Inc., San Jose, CA (US)

( * ) Notice: Subject to any disclaimer, the term of this patent is extended or adjusted under 35 U.S.C. 154(b) by 161 days.

(21) Appl. No.: 11/535,927

(22) Filed: Sep. 27, 2006

(65) Prior Publication Data

US 2007/0272558 A1 Nov. 29, 2007

(51) Int. Cl.
*C25D 3/00* (2006.01)
*C25D 3/56* (2006.01)
*B22F 7/00* (2006.01)

(52) U.S. Cl. .................. 205/261; 205/238; 106/1.25

(58) Field of Classification Search .............. 106/1.25; 205/261, 238
See application file for complete search history.

(56) References Cited

U.S. PATENT DOCUMENTS

| 2,582,377 | A | | 1/1952 | Brown | 204/105 |
|---|---|---|---|---|---|
| 2,793,179 | A | | 5/1957 | De la Breteque | 204/105 |
| 2,873,232 | A | * | 2/1959 | Zimmerman | 205/122 |
| 3,061,528 | A | * | 10/1962 | Foley, Jr. | 205/261 |
| 4,488,942 | A | * | 12/1984 | Martin et al. | 205/245 |
| 5,304,403 | A | | 4/1994 | Schlesinger et al. | 427/437 |
| 5,489,372 | A | | 2/1996 | Hirano | 205/109 |
| 5,501,786 | A | | 3/1996 | Gremion | 205/109 |
| 5,554,211 | A | * | 9/1996 | Bokisa et al. | 106/1.22 |
| 5,695,627 | A | | 12/1997 | Nakazawa | 205/227 |
| 5,730,852 | A | | 3/1998 | Bhattacharya | 205/192 |
| 5,804,054 | A | | 9/1998 | Bhattacharya | 205/239 |
| 5,871,630 | A | | 2/1999 | Bhattacharya | 205/192 |
| 2004/0206390 | A1 | | 10/2004 | Bhattacharya | 136/262 |
| 2005/0215079 | A1 | | 9/2005 | Taunier et al. | 438/796 |
| 2006/0151331 | A1 | * | 7/2006 | Taunier et al. | 205/316 |

FOREIGN PATENT DOCUMENTS

FR 2849532 A1 * 7/2004

OTHER PUBLICATIONS

Xia et al., "Influence of Na Citrate Concentration on Cu(In,Ga)Se2 Thin Films by Electrodeposition", Rengong Jingti Xuebao (Aug. 2005), vol. 34, No. 4, pp. 704-708.*
Ganchev et al., "Preparation of Cu(In,Ga)Se2 layers by Selenization of Electrodeposited Cu-In-Ga Precursors", Thin Solid Films, vols. 511-512 (no month, 2006), pp. 325-327.*
Bouabid et al., "CuIn1-xGaxSe2 Thin Films Prepared by One Step Electrodeposition", J. Phys. IV France, vol. 123 (no month, 2005), pp. 53-57.*
Search Report issued Jan. 17, 2008 in corresponding PCT/US2007/79356.
Andreoli, et al., "Electrochemical Approaches to $GaAs_{1-x}Sb_x$ Thin Films", *J. Electroanalyt. Chem.*, vol. 385, 1995, p. 265-268, no month.
Backris, et al., "Electrodepotiion of Gallium on Liquid and Solid Gallium Electrodes in Alkaline Solutions", *J. Electrochem. Soc.*, vol. 109, 1962, p. 48, no month.
Bhattacharya, R.N., et al., "$CuIn_{1-x}Se_2$-based Photovoltaic Cells from Electrodeposited Precursor Films", *Solar Energy Mats & Solar Cells*, vol. 76, 2003, pp. 331-337, no month.
Binsma, J.J., et al., "Preparation of Thin $CuInS_2$ Films via a Two Stage Process", *Thin Solid Films*, 97, 1982, pp. 237-243, no month.
Calixto, M.E., et al., "$CuInSe_2$ Thin Films Formed by Selenization of Cu-In Precursors", *J. of Mats. Sci.*, 33, 1998, pp. 339-345, no month.
Fernandez, et al., "Electroeposited and Selenized ($CuInSe_2$) (CIS) Thin Films for Photovoltaic Applications", *Solar Energy Materials and Solar Cells*, 52, 1998, pp. 423-431, no month.
Friedfeld, R., et al., "Electrodeposition of $CuIn_xGa_{1-x}Se_2$ Thin Films", *Solar Energy Mats. & Solar Cells*, 58, 1999, pp. 375-385, no month.
Fritz, H.P., et al., "A New Electrochemical Method for Selenization of Stacked CuIn Layers and Preparation of $CuInSe_2$ by Thermal Annealing", *Thin Solid Films*, 247, 1994, pp. 129-133, no month.
Ganchev, M., et al., "Preparation of $Cu(In,Ga)Se_2$ Layers by Selenization of Electrodeposited Cu-In-Ga Precursors", *Thin Solid Films*, 511-512, 2006, pp. 325-327, no month.

(Continued)

*Primary Examiner*—Edna Wong
(74) *Attorney, Agent, or Firm*—Pillsbury Winthrop Shaw Pittman LLP

(57) ABSTRACT

The present invention relates to gallium (Ga) electroplating methods and chemistries to deposit uniform, defect free and smooth Ga films with high plating efficiency and repeatability. Such layers may be used in fabrication of electronic devices such as thin film solar cells. In one embodiment, the present invention provides a solution for application on a conductor that includes a Ga salt, a complexing agent, a solvent, and a Ga-film having submicron thickness is facilitated upon electrodeposition of the solution on the conductor. The solution may further include one or both of a Cu salt and an In salt.

34 Claims, No Drawings

OTHER PUBLICATIONS

Grindle, S.P., et al., "Preparation and Properties of CuInS$_2$ Thin Films Produced by Exposing rf-Sputtered Cu-In Films to an H$_2$S Atmosphere", *Appl. Phys. Lett*, 35(1) Jul. 1, 1979, pp. 24-26.

Guillen, C., et al., "New Approaches to Obtain CuIn$_{1-x}$Ga$_x$Se$_2$ Thin Films by Combining Electrodeposited and Evaporated Precursors", *Thin Solid Films*, 323, 1998, pp. 93-98, no month.

Guillen, C.,et al., "CuInSe$_2$ Thin Films Obtained by a Novel Electrodeposition and Sputtering Combined Method," *Vacuum*, 58, 2000, pp. 594-601, no month.

Gupta, A., et al., "CuInS$_2$ Films Prepared by Sulfurization of Electroless Deposited Cu-In Alloy", *Solar Energy Mats.*, 18, 1988, pp. 1-8, no month.

Kampmann, A., et al., "Electrodeposition of CIGS on Metal Substrates", *Mat. Res. Soc. Symp. Proc.*, 763, 2003, pp. B8.5.1-B8.5.6, no month.

Kapur, V.K., et al., "Low Cost Thin Film Chalcopyrite Solar Cells", *IEEE*, 1985, p. 1429-1432, no month.

Kapur, V.K., et al., "Low Cost Methods for the Production of Semiconductor Films for CuInSe$_2$/CdS Solar Cells", *Solar Cells*, 21, 1987, pp. 65-72, no month.

Kim, et al., "Preparation of CuInSe$_2$ Thin Films Using Electrodeposited In/Cu Metallic Layer", *First WCPEC*, Dec. 5-9, 1994, Hawaii, *IEEE*, pp. 202-205.

Kumar, et al., "Properties of CuInSe$_2$ Films Prepared by the Rapid Thermal Annealing Technique", *Thin Solid Films*, 223, 1993, pp. 109-113, no month.

Lokhande, C., et al., "Preparation of CuInSe$_2$ and CuInS$_2$ Films by Reactive Annealing in H$_2$ Se$_2$ or H$_2$ S", *Solar Cells,*, 21, 1987, pp. 215-224, no month.

Prosini, P.P., et al., "Electrodeposition of Copper-Indium Alloy Under Diffusion-Limiting Current Control", *Thin Solid Films*, 288, 1996, pp. 90-94, no month.

Sundarajan, et al., "The Electrodeposition of Gallium from a Chloride Bath", *J. Less. Comm. Metals.*, vol. 11, 1966, p. 360-364, no month.

Taunier, S., et al., "Cu(In,Ga)(S,Se)$_2$ Solar Cells and Modules by Electrodeposition", *Thin Solid Films*, 480-481, 2005, pp. 526-531, no month.

Wijesundera, R.P., et al., "Preparation of CuInS$_2$ Thin Films by Electrodeposition and Sulphurisation for Applications in Solar Cells", *Solar Energy Mats. & Solar Cells*, 81, 2004, pp. 147-154, no month.

Zank, J., et al., "Electrochemical Codeposition of Indium and Gallium for Chalcopyrite Solar Cells", *Thin Solid Films*, 286, 1996, pp. 259-263, no month.

\* cited by examiner

EFFICIENT GALLIUM THIN FILM ELECTROPLATING METHODS AND CHEMISTRIES

FIELD OF THE INVENTION

This invention relates to gallium (Ga) electroplating methods and chemistries to deposit uniform, defect free and smooth Ga films with high plating efficiency and repeatability. Such layers may be used in fabrication of electronic devices such as thin film solar cells.

BACKGROUND

Gallium is an element that is used in semiconductor and electronics industries. Gallium is generally recovered as a by-product from Bayer-process liquors containing sodium aluminate (see for example, U.S. Pat. Nos. 2,793,179 and 2,582,377). Although electrodeposition is a common method to recover bulk Ga (see for example, U.S. Pat. No. 3,904,497) out of basic or acidic solutions, or to purify bulk Ga, there have not been many applications for this material where thin films were deposited with controlled uniformity, morphology and thickness. Therefore, only a few electroplating bath chemistries and processes were developed and reported for the deposition of thin layers of Ga on substrates for electronic applications. For example, Ga-chloride solutions with pH values varying between 0 and 5 were evaluated by S. Sundararajan and T. Bhat (J. Less Common Metals, vol. 11, p. 360, 1966) for electroplating of Ga films. Other researchers investigated Ga deposition out of high pH solutions comprising water and/or glycerol. Bockris and Enyo, for example, used an alkaline electrolyte containing Ga-chloride and NaOH (J. Electrochemical Society, vol. 109, p. 48, 1962), whereas, P. Andreoli et al.(Journal of Electroanalytical Chemistry, vol. 385, page.265, 1995) studied an electrolyte comprising KOH and Ga-chloride.

The above mentioned prior-art methods and plating baths reportedly all achieved Ga film deposition. There are, however, some common problems associated with the prior-art electrochemical deposition processes. These problems include, low cathodic deposition efficiency due to excessive hydrogen generation, poor repeatability of the process, partly due to the poor cathodic efficiency, and the poor quality of the deposited films such as their high surface roughness and poor morphology. These issues may not be important for bulk Ga electroplating or for Ga films deposited for the purpose of investigating scientific topics such as deposition mechanisms. Poor film morphology or inadequate thickness control may also not be important for the electrically inactive applications of Ga layers, such as their use as lubricating coatings etc. However, properties of the Ga films become important for certain new electronic applications where Ga film plays a role in forming an active portion of an electronic device, such as a solar cell.

Prior-art Ga electroplating techniques utilizing simple electrolytes operating under acidic or basic pH values are not suitable for the above mentioned electronics applications for a variety of reasons, including that they result in poor plating efficiencies and films with rough morphology (typically surface roughness larger than about 20% of the film thickness). Gallium is a difficult metal to deposit without excessive hydrogen generation on the cathode because Ga plating potential is high. Hydrogen generation on the cathode causes the deposition efficiency to be less than 100% because some of the deposition current gets used on forming the hydrogen gas, rather than the Ga film on the substrate or cathode.

Hydrogen generation and evolution also causes poor morphology and micro defects on the depositing films due to the tiny hydrogen bubbles sticking to the surface of the depositing film, masking the micro-area under them, and therefore impeding deposit on that micro-area. This causes micro-regions with less than optimum amount of Ga in the film stack. Poor plating efficiencies inherently reduce the repeatability of an electrodeposition process because hydrogen generation phenomenon itself is a strong function of many factors including impurities in the electrolyte, deposition current densities, small changes on the morphology or chemistry of the substrate surface, temperature, mass transfer etc. As at least one of these factors may change from run to run, hydrogen generation rate may also change, changing the deposition efficiency.

Electrodeposition of Ga out of low pH aqueous electrolytes or solutions may suffer from low cathodic efficiencies arising from the presence of a large concentration of $H^+$ species in such electrolytes. Therefore, hydrogen gas generation may be expected to lessen at higher pH values. However, as the pH is increased in the solution, Ga forms oxides and hydroxides which may precipitate as reported in the literature. Only at extremely alkaline pH values these oxides/hydroxides dissolve as soluble Ga species. Therefore, it becomes possible to electrodeposit Ga in a bath of pH>14 containing Ga salts as was done in prior-art techniques using high concentrations of KOH and NaOH in the bath formulation. High concentrations of alkaline species, however, cause corrosion problems for the equipment as well as the cathode material itself. There is also a limit of the Ga amount that can be dissolved in the form of acidic Ga salts ($GaCl_3$, $Ga(NO_3)_3$ etc) in such solutions before Ga starts to precipitate. Therefore, the pH needs to be adjusted again by further addition of alkaline species such as NaOH and KOH. As pointed out above, solutions comprising a large molar amount of caustics are difficult to handle and they also have high viscosity. High viscosity makes the hydrogen bubbles formed on the cathode stick more to the cathode making it very difficult to remove them by stirring or other means of mass transfer. As explained above, such gas bubbles on the cathode surface increase defectivity of the deposited Ga layer.

As can be seen from the foregoing discussion there is a need to develop new electroplating chemistries and methods that can provide high quality electrodeposited Ga layers which may be used in electronic applications such as in processing thin film solar cells.

SUMMARY OF THE INVENTION

The present invention relates to gallium (Ga) electroplating methods and chemistries to deposit uniform, defect free and smooth Ga films with high plating efficiency and repeatability. Such layers may be used in fabrication of electronic devices such as thin film solar cells.

In one embodiment, the present invention provides a solution for application on a conductor. The solution includes a Ga salt, a complexing agent, and a solvent, wherein the solution provides by electrodeposition a sub-micron thickness Ga containing film on the conductor.

In another embodiment of the invention, the solution further includes one or both of a Cu salt and an In salt, and the pH of the solution is substantially 7 or higher.

In another embodiment of the invention there is provided a method of obtaining a Ga containing film having a sub micron thickness on a surface of a conductor.

DETAILED DESCRIPTION OF THE INVENTION

The present invention provides a method to electroplate Ga films onto conductive surfaces at high deposition efficiency and repeatability. Two particular conductive surfaces used in this invention are Cu and In surfaces. By electroplating Ga in an efficient manner on Cu and In surfaces, the present invention may be used to manufacture Cu/In/Ga, Cu/Ga/In, In/Ga/Cu and other metallic stacks, which in turn may be employed in processing CIGS(S) type solar cell absorbers.

In this regard, there has been significant progress by the present assignee, including inventors, in thin film solar cell technologies. Copper-indium-selenide-(sulfide), or CIGS(S) and similar materials in the family of Group IBIIIAVIA chalcopyrite semiconductors have emerged as important compounds for thin film polycrystalline solar cell applications. In a recently developed "two-stage" processing method for growth of CIGS(S) thin films, for example, controlled amounts of Cu, In and Ga are electrodeposited in the form of Cu, In and Ga containing thin film stacks such as Cu/In/Ga, Cu/Ga/In, In/Cu/Ga, Ga/In/Cu, Ga/Cu/In, Cu/Ga/Cu/In, Cu/In/Cu/Ga etc. stacks, on a base such as a substrate coated with a conductive contact layer. These stacks are then reacted with Se and/or S to form a thin film of the CIGS(S) compound on the contact layer. Details of such a processing approach may be found in the following patent applications, each of which are expressly incorporated by reference herein:

U.S. Provisional Application Ser. No. 60/756,750 filed Jan. 6, 2006 entitled "Precursor Copper Indium and Gallium for Selenide (Sulfide) Compound Formation";

U.S. Provisional Application Ser. No. 60/782,373 filed Mar. 14, 2006 entitled: Method and Apparatus for Converting Precursor Layers Into Photovoltaic Absorbers";

U.S. Provisional Application Ser. No. 60/782,373 filed Mar. 14, 2006 entitled "Method and Apparatus for Converting Precursor Layers Into Photovoltaic Absorbers";

U.S. Provisional Application Ser. No. 60/820,479 filed Jul. 26, 2006 entitled "Technique for Doping Compound Layers Used In Solar Cell Fabrication";

U.S. patent application Ser. No. 11/081,308 filed Mar. 15, 2005 entitled "Technique and Apparatus for Depositing Thin Layers of Semiconductors For Solar Cell Fabrication";

U.S. patent application Ser. No. 11/266,013 filed Nov. 2, 2005 entitled "Technique and Apparatus For Depositing Layers of Semiconductors For Solar Cell and Module Fabrication"; and U.S. patent application Ser. No. 11/462,685 filed Aug. 4, 2006 entitled "Technique For Preparing Precursor Films and Compound Layers for Thin Film Solar Cell Fabrication and Apparatus Corresponding Thereto.

It should be appreciated that in this processing technique, control of thickness for the deposited layers, such as the Cu, In and Ga layers is extremely important. The thickness of Ga layers in such stacks is typically sub-micron, more typically in the range of 50-200 nm. The electrical and optical properties of the compound semiconductors such as CIGS(S) are highly sensitive to the stoichiometry or composition of the material. Specifically, these properties strongly depend on the Cu/(In+Ga) and Ga/(Ga+In) molar ratios throughout the film. Efficiency of solar cells fabricated on such compound semiconductor layers, in turn, depends on the optical and electrical properties of the layers. Therefore, high yield and repeatability of a solar cell manufacturing process utilizing two-stage processing and electrodeposition of at least one of a Cu layer, an In layer and a Ga layer critically depend on the repeatability of the deposited thickness of the electroplated layer(s), from run to run. Furthermore, micro-scale compositional uniformity requires these electrodeposited films with sub-micron thickness to have smooth morphology with a surface roughness of typically less than 10% of the film thickness, and with desirable and controllable microstructure, which is typically a small-grain microstructure with submicron size grains. Stacks utilizing Ga films with rough surface morphology, for example, would cause the Ga content to be changing locally, in micro-scale throughout the film although on the average the Ga content may be in the acceptable range. It should be noted that the typical acceptable CIGS(S) film composition has a Cu/(In+Ga) molar ratio in the 0.8-1.0 range whereas the Ga/(Ga+In) molar ratio may be in the range of 0.1-0.3.

With these thin film stacks, copper layers (or In layers) may be electroplated or sputter deposited on a base comprising a substrate which, on its surface may have a conductive contact film such as a Mo layer and/or a Ru-containing layer. The substrate may be a metallic foil, glass or polymeric sheet or web. The Ru containing layer on the substrate surface may be a Ru layer, a Ru-alloy layer, a Ru compound layer or a stack containing Ru such as a Mo/Ru stack or in general a M/Ru stack, where M is a conductor or semiconductor. Gallium electroplating on the Cu surface (or the In surface) can be carried out at various current densities, such as at 5, 10, 20, 30, 40 and 50 mA/cm$^2$, using the electrolytes of the present invention. Both DC and/or variable (such as pulsed or ramped) voltage/current waveforms may be used for electroplating the Ga layer.

In particular, this invention provides a class of Ga plating baths containing complexing agents. Complexing agents complex the Ga in the bath, forming complexes which may be in general represented by $Ga^{k+}(L^{m-})_n$. During plating, a cathodic reaction of $Ga^{k+}(L^{m-})_n + ke^- = Ga + nL^{m-}$ may take place causing Ga deposition on the cathode surface and release of the complexing species. The value of "k" may be 3. Complexing agents may serve multiple purposes. Among these are: i) reduction of free Ga ion concentration in the bath, ii) reduction of Ga salt precipitation, and, iii) maintenance of a stable pH. With the assistance of complexing agents, Ga salts may be dissolved in a basic solution at reasonably large concentrations of 0.1-1.0M, without precipitation, so that hydrogen generation is reduced and deposition efficiency is enhanced. Some of the advantages for the bath compositions of the present invention are: i) since the pH is typically higher than 7, preferably higher than 9, hydrogen generation is reduced, ii) since the pH is preferably lower than 14, excessive corrosion problems are avoided, iii) complexed Ga species form small grained smooth Ga deposits in a repeatable manner.

The invention will now be described by presenting several examples. The electroplating experiments in these examples were carried out using a potentiostat/galvanostat (EG&G Model 263 A). During plating, the solutions were stirred. The substrates for the plating tests included stainless steel and soda-lime glass, both coated with a 500 nm thick Mo layer followed by a Ru layer which had a thickness in the range of 5-100 nm. First, a 50-200 nm of Cu layer was electroplated on the Ru surface. Gallium was then electroplated on the Cu surface and the results were evaluated. The surface areas for the substrates were varied from several cm$^2$ to several hundreds cm$^2$ to understand the suitability of the method for large scale manufacturing. After the Ga deposition, the uniformity and the plating efficiency were evaluated by dissolving various portions of the film and using Atomic Absorption Spectroscopy to measure the Ga amounts in the dissolved samples.

EXAMPLE 1

Citrate as the Complexing Agent

A set of exemplary aqueous plating baths were prepared containing 0.2-0.5 M $GaCl_3$, and 0.5-0.8 M sodium citrate ($Na_3C_6H_5O_7$). The pH was adjusted to a range between 10 and 13. Gallium was electrodeposited on the copper surface at current densities of 30-50 $mA/cm^2$. Highly adherent Ga films with surface roughness of <10 nm were obtained for a thickness of 100 nm. The plating efficiency was measured and found to be in the 85-100% range, the higher current density yielding more efficient deposition process. Gallium was also plated on other metal surfaces also using the citrate containing complexed baths. Deposition on Ru surface directly yielded a plating efficiency of 75-90%. On the surface of In, Ga deposition efficiency reached 100%. An accelerated test that lasted 50 hours demonstrated that the bath chemistry was stable without any oxide/hydroxide precipitation and the deposition efficiencies were repeatable.

EXAMPLE 2

EDTA as the Complexing Agent

An aqueous plating bath was formulated with 0.2 M $GaCl_3$ and 0.4 Molar EDTA. The pH was adjusted to the range of 12-14 using NaOH. The plating tests were carried out on electroplated copper surfaces at current densities of 10-50 $mA/cm^2$. All Ga films were shiny with smooth morphology. Surface roughness was <10 nm for 100 nm thick films. In this case the deposition efficiency was found to be higher at current densities around 20-30 $mA/cm^2$ compared to lower and higher current density values. These efficiency values were in the range of 75-95%.

EXAMPLE 3

Glycine as the Complexing Agent

An aqueous plating bath was formulated with 0.2 M $GaCl_3$ and 0.5 M Glycine. The pH was adjusted to the range of 11-13 using NaOH. The plating tests were carried out on the surfaces of electroplated copper at current densities of 10-50 $mA/cm^2$. All Ga films were shiny with smooth surfaces. Surface roughness was <10 nm for 100 nm thick layers. In this case the deposition efficiency was found to be in the range of 75-90% at 20-30 $mA/cm^2$. Efficiency went down at lower and higher current density values.

Although three specific complexing agents, i.e. citrate, EDTA and glycine have been used for bath formulation in the above examples, it is possible to employ other complexing agents with carboxylic and/or ammnine chelating groups in addition to or in place of those that are cited. Citrates used may be organically modified such as triethyl citrate and tributyl citrate. Other complexing agents include but are not limited to tartrates (such as sodium tartrate, lithium tartrate, potassium tartrate, sodium potassium tartrate, diethyl tartrate, dimethyl tartrate, dibutyl tartrate, diisopropyl tartrate, and ammonium tartrate), oxalates (such as sodium, potassium and lithium oxalates), ammonia and ammonium salts, ethylenediamine, nitrilotriacetic acid and its salts, hydroxyethylethylenediaminetriacetic acid and its salts, aminobutyric acids and their salts, amino acids including alanine, valine, leucine, isoleucine, praline, phenylalanine, tyrosine, tryptophan, lysine, arginine, histidine, aspartate, glutamate, serine, threomine, cysteine, methionine, asparagine, and glutamine.

It should be noted that although some of these complexing agents may perform well even in acidic solutions, the preferred Ga plating bath compositions of this invention have a pH value of higher than 7, preferably higher than 9, and most preferably in the range of 9 to 14. The above examples employed simple aqueous chemistries with water as the solvent. Although water is the preferred solvent in the formulation of Ga plating baths of the preferred invention, it should be appreciated that organic solvents may also be added in the formulation, partially or wholly replacing the water. Such organic solvents include but are not limited to glycerin, alcohols, ethylene glycol, ethylene carbonate, propylene carbonate, acetonitrile, formamide, dimethyl sulfoxide, sulfolane etc.

The examples above utilized DC voltage/current during the Ga electrodeposition process. It should be noted that pulsed or other variable voltage/current sources may also be utilized to obtain the high plating efficiencies and high quality Ga deposits employing the Ga plating baths of the present invention. The temperature of the Ga electroplating baths may be in the range of 5-150 C depending upon the nature of the solvent. It is preferable to keep this temperature below the boiling point of the solvent. The preferred bath temperature for water-based formulation is in the range of 10-60 C. The most preferred range is 15-30 C.

The electroplating baths of the present invention may comprise additional ingredients. These include, but are not limited to, grain refiners, surfactants, dopants, other metallic or non-metallic elements etc. For example, organic additives such as surfactants, suppressors, levelers, accelerators etc. may be included in the formulation to refine its grain structure and surface roughness. There are many such additives commonly used in the field. Organic additives include but are not limited to polyalkylene glycol type polymers, propane sulfonic acids, coumarin, saccharin, furfural, acryonitrile, magenta dye, glue, SPS, starch, dextrose, etc. It should be noted that other materials may be included in the bath formulation to deposit thin layers of Ga-alloys or mixtures of Ga with the other materials. For example, addition of Cu species (such as Cu-sulfate, Cu-chloride etc) in the bath formulation allows deposition of Cu—Ga alloys and/or thin films comprising a mixture of Cu and Ga. Similarly, In may be added in the formulation to obtain Ga—In alloys and/or films comprising mixture of Ga and In. Addition of both In and Cu may yield deposits comprising Cu, In and Ga in controlled amounts. Dopants may also be added in quantities that allow deposition of "doped Ga" films. A doped Ga film comprises a dopant in a quantity that is typically less than 1 atomic percent, preferably less than 0.1 atomic percent. Such dopants include but are not limited to Na, Li, K, S, Se, Sb, P etc.

The Ga layers produced using the bath compositions of the present invention were employed to fabricate exemplary all-electroplated metallic stacks on bases comprising stainless steel substrates coated with Mo/Ru or only Ru layers. These stacks had various deposition sequences yielding base/Cu/Ga/In, base/Cu/Ga/Cu/In, base/Cu/In/Cu/Ga and base/Cu/In/Ga structures. An indium sulfamate-based plating bath marketed by Indium Corporation of America was utilized for In film depositions. The stacks were reacted in a tube furnace at 500 C for 50 minutes with $Ar+H_2Se$ gas mixture, forming $Cu(In,Ga)Se_2$ absorbers. The Cu/(In+Ga) molar ratio was kept in the 0.88-0.94 range while the Ga/(Ga+In) molar ratio was nominally 30% in these samples. After the reaction step a 100 nm thick CdS layer was formed on the absorber surface yielding a base/Cu(In,Ga)Se$_2$/CdS structure. A well known chemical dip method was used for CdS deposition out of a solution comprising Cd-sulfate, Thiorea, triethylenamine (TEA) and ammonia. A ZnO/ITO transparent conductive layer was then deposited over the CdS film by the sputtering technique. Solar cell was completed by evaporating Ni finger contacts over the ITO layer. Solar cell efficiencies as high as 11% were recorded from these devices demonstrating the quality of the electrodeposited stacks comprising the Ga layers of the present invention.

What we claim is:

1. A solution for application of a sub-micron thick gallium (Ga) containing film on a conductor comprising:
   a gallium (Ga) salt,
   a complexing agent selected from the group consisting of a citrate, ethylenediaminetetraacetic acid (EDTA), and glycine, and
   a solvent, and
   wherein the pH of the solution is higher than 7.0.

2. The solution of claim 1 wherein the solution provides electrodeposition of the sub-micron thick gallium (Ga) containing film on the conductor and the gallium (Ga) containing film is a substantially pure gallium (Ga) film.

3. The solution of claim 1 wherein the gallium (Ga) salt is selected from the group consisting of gallium (Ga)-chloride, gallium (Ga)-sulfate, gallium (Ga)-acetate and gallium (Ga)-nitrate.

4. The solution of claim 3 wherein the citrate is at least one of sodium citrate, lithium citrate, ammonium citrate, potassium citrate, and an organically modified citrate, wherein the solvent is water and wherein the pH value of the solution is in the range of 9-14.

5. The solution of claim 3 wherein the citrate is at least one of sodium citrate, lithium citrate, ammonium citrate, potassium citrate, and an organically modified citrate.

6. The solution of claim 5 wherein the solvent is water.

7. The solution of claim 1 wherein the citrate is at least one of sodium citrate, lithium citrate, ammonium citrate, potassium citrate, and an organically modified citrate.

8. The solution of claim 1 wherein the solvent is water.

9. The solution of claim 1 further comprising an organic additive.

10. The solution of claim 1 further comprising at least one of a copper (Cu) salt and an indium (In) salt.

11. The solution according to claim 10 wherein the pH of the solution is within a range of 9-14.

12. The solution of claim 10 wherein the solution is essentially free of any Group VIA elements and compounds thereof.

13. The solution of claim 1 further comprising both of a copper (Cu) salt and an indium (In) salt.

14. The solution of claim 13 wherein the pH of the solution is within a range of 9-14.

15. The solution of claim 13 wherein the solution is essentially free of any Group VIA elements and compounds thereof.

16. The solution of claim 1 further comprising a pH adjustment agent that is one of NaOH and KOH.

17. A method of obtaining a gallium (Ga) containing film on a surface of a conductor comprising the steps of:
   obtaining a solution that includes a gallium (Ga) salt, a complexing agent, and a solvent, wherein the solution has a pH higher than 7.0, and wherein the complexing agent is selected from the group consisting of a citrate, ethylenediaminetetraacetic acid (EDTA), and glycine;
   applying the solution onto an anode and the surface of the conductor, providing a potential difference between the anode and the conductor, and electrodepositing the gallium (Ga) containing film on the surface of the conductor.

18. The method of claim 17 wherein the gallium (Ga) containing film is a substantially pure gallium (Ga) film.

19. The method of claim 17 wherein the conductor is copper.

20. The method of claim 17 wherein the conductor is indium.

21. The method according to claim 17 wherein the pH of the solution is within a range of 9-14.

22. The method of claim 17 wherein the solution obtained in the step of obtaining includes the gallium (Ga) salt selected from the group consisting of gallium (Ga)-chloride, gallium (Ga)-sulfate, gallium (Ga)-acetate and gallium (Ga)-nitrate.

23. The method of claim 22 wherein the solution obtained in the step of obtaining includes as the citrate at least one of sodium citrate, lithium citrate, ammonium citrate, potassium citrate, and an organically modified citrate, wherein the solvent is water and wherein the pH value of the solution is in the range of 9-14.

24. The method of claim 17 wherein the solution obtained in the step of obtaining includes as the citrate at least one of sodium citrate, lithium citrate, ammonium citrate, potassium citrate, and an organically modified citrate.

25. The method of claim 17 wherein the conductor is one of copper and indium, and wherein the solution obtained in the step of obtaining includes as the citrate at least one of sodium citrate, lithium citrate, ammonium citrate, potassium citrate, and an organically modified citrate.

26. The method of claim 25 wherein the solution obtained in the step of obtaining includes water as the solvent.

27. The method of claim 17 wherein the solution obtained in the step of obtaining includes water as the solvent.

28. The method of claim 17 wherein the solution obtained in the step of obtaining further includes an organic additive.

29. The method of claim 17 wherein the solution obtained in the step of obtaining further includes at least one of a copper (Cu) salt and an indium (In) salt.

30. The method according to claim 29 wherein the pH of the solution is within a range of 9-14.

31. The method of claim 30 wherein the solution obtained in the step of obtaining is essentially free of any Group VIA elements and compounds thereof.

32. The method of claim 17 wherein the solution obtained in the step of obtaining further includes both a copper (Cu) salt and an indium (In) salt.

33. The method according to claim 32 wherein the pH of the solution is within a range of 9-14.

34. The method of claim 33 wherein the solution obtained in the step of obtaining is essentially free of any Group VIA elements and compounds thereof.

* * * * *